(12) United States Patent
Park et al.

(10) Patent No.: US 7,999,260 B2
(45) Date of Patent: Aug. 16, 2011

(54) DISPLAY SUBSTRATE AND DISPLAY APPARATUS HAVING THE SAME

(75) Inventors: Dae-Jin Park, Incheon (KR); Kyu-Young Kim, Suwon-si (KR); Hyung-Il Jeon, Incheon (JP); Ju-Han Bae, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 175 days.

(21) Appl. No.: 12/420,767

(22) Filed: Apr. 8, 2009

(65) Prior Publication Data
US 2010/0078641 A1    Apr. 1, 2010

(30) Foreign Application Priority Data
Sep. 26, 2008  (KR) .............................. 2008-0094786

(51) Int. Cl.
*H01L 27/12* (2006.01)
(52) U.S. Cl. .......................................... 257/59; 257/72
(58) Field of Classification Search .................. 257/59, 257/72, 508, E27.13, E27.131
See application file for complete search history.

(56) References Cited

U.S. PATENT DOCUMENTS

| 2005/0153476 A1* | 7/2005 | Park et al. ................... 438/98 |
| 2007/0122649 A1* | 5/2007 | Lee et al. ................... 428/674 |

* cited by examiner

*Primary Examiner* — Kiesha R Bryant
*Assistant Examiner* — Tucker Wright
(74) *Attorney, Agent, or Firm* — Innovation Counsel LLP

(57) ABSTRACT

In a display substrate and a method of the display substrate, a bank pattern provided with openings formed therethrough is formed by an imprint method, and the openings are filled with a conductive material by an inkjet method to form a data line and a pixel electrode, in accordance with one or more embodiments. When the display substrate is manufactured, a patterning process by a photolithography method may be replaced with the patterning process by the imprint method and the inkjet method, which simplifies a manufacturing method of the display substrate. In case that the display substrate includes a plastic substrate, the plastic substrate may be prevented from being deformed during a photolithography process.

13 Claims, 11 Drawing Sheets

DISPLAY SUBSTRATE AND DISPLAY APPARATUS HAVING THE SAME

CROSS-REFERENCE TO RELATED APPLICATION

This application claims priority to and benefit of Korean Patent Application No. 2008-94786, filed Sep. 26, 2008, the contents of which are herein incorporated by reference in their entirety.

BACKGROUND

1. Technical Field

The present invention relates generally to a display substrate, a method of manufacturing the display substrate, and a display apparatus having the display substrate.

2. Related Art

Generally, a display apparatus includes a display substrate to display an image. The display substrate includes gate lines and data lines that are insulated from the gate lines. The gate lines cross the data lines to define a plurality of pixel areas on the display substrate. A thin film transistor (TFT) and a pixel electrode, electrically connected to the thin film transistor, are arranged in each pixel area in the display substrate.

When the display substrate is a plastic substrate, the display substrate is flexible and is not easily damaged by an external pressure, such as when flexibly bent. However, the plastic display substrate may be deformed by external extremes of temperature and/or humidity. When the plastic display substrate is deformed during a manufacturing process, it may be difficult to accurately arrange elements on the plastic display substrate. For example, in a case that the thin film transistor is formed on the plastic display substrate, the plastic display substrate may be bent due to the heat generated when forming an active pattern under a high temperature condition. As a result, a source electrode and a drain electrode may be difficult to form in an accurate fashion on the active pattern, which is formed on the deformed plastic display substrate.

SUMMARY

An exemplary embodiment of the present invention provides a display substrate manufactured using an imprint method or an inkjet method instead of a photolithography method.

Another exemplary embodiment of the present invention provides a display apparatus having the display substrate.

Another exemplary embodiment of the present invention provides a method of manufacturing the display substrate.

In an exemplary embodiment of the present invention, a display substrate includes a substrate having pixel areas, a gate line arranged on the substrate, a data line insulated from the gate line and arranged on the substrate, a bank pattern that is provided with a first opening formed therethrough and arranged on the substrate to cover the gate line and the data line, and a pixel electrode arranged in each pixel area to receive a data signal from the data line. In one implementation, the data line includes at least one sub-data line and at least one main data line contained in the first opening to be electrically connected to the sub-data line.

In another exemplary embodiment of the present invention, a display apparatus includes a first substrate having pixel areas, a second substrate facing the first substrate, a gate line arranged on the first substrate, a data line insulated from the gate line and arranged on the first substrate, a bank pattern that is provided with a first opening formed therethrough and arranged on the first substrate to cover the gate line and the data line, and a pixel electrode arranged in each pixel area to receive a data signal from the data line. In one implementation, the data line includes at least one sub-data line and at least one main data line contained in the first opening to be electrically connected to the sub-data line.

In another exemplary embodiment of the present invention, a method of manufacturing a display substrate is provided as follows. A gate line is formed on a substrate having pixel areas, a sub-data line insulated from the gate line is formed on the substrate, a bank layer is formed on the substrate to cover the gate line and the sub-data line. After forming the bank layer, the bank layer is patterned to form a bank pattern through which a first opening is formed such that the sub-data line is partially exposed through the first opening. A main data line contained in the first opening and electrically connected to the sub-data line is formed to form a data line including the sub-data line and the main data line, and a pixel electrode is formed on the substrate corresponding to each pixel area.

In one embodiment, a patterning process using a photolithography method may be replaced with a patterning process using an imprint method or an inkjet method, which may simplify the manufacturing method of the display substrate. In a case where the display substrate includes a plastic substrate, the plastic substrate is prevented from being deformed due to the photolithography method, thereby accurately arranging elements of the display substrate on the plastic substrate.

BRIEF DESCRIPTION OF THE DRAWINGS

The above and other advantages of the present invention will become more readily apparent by reference to the following detailed description when considered in conjunction with the accompanying drawings wherein.

DETAILED DESCRIPTION

Figure 1:
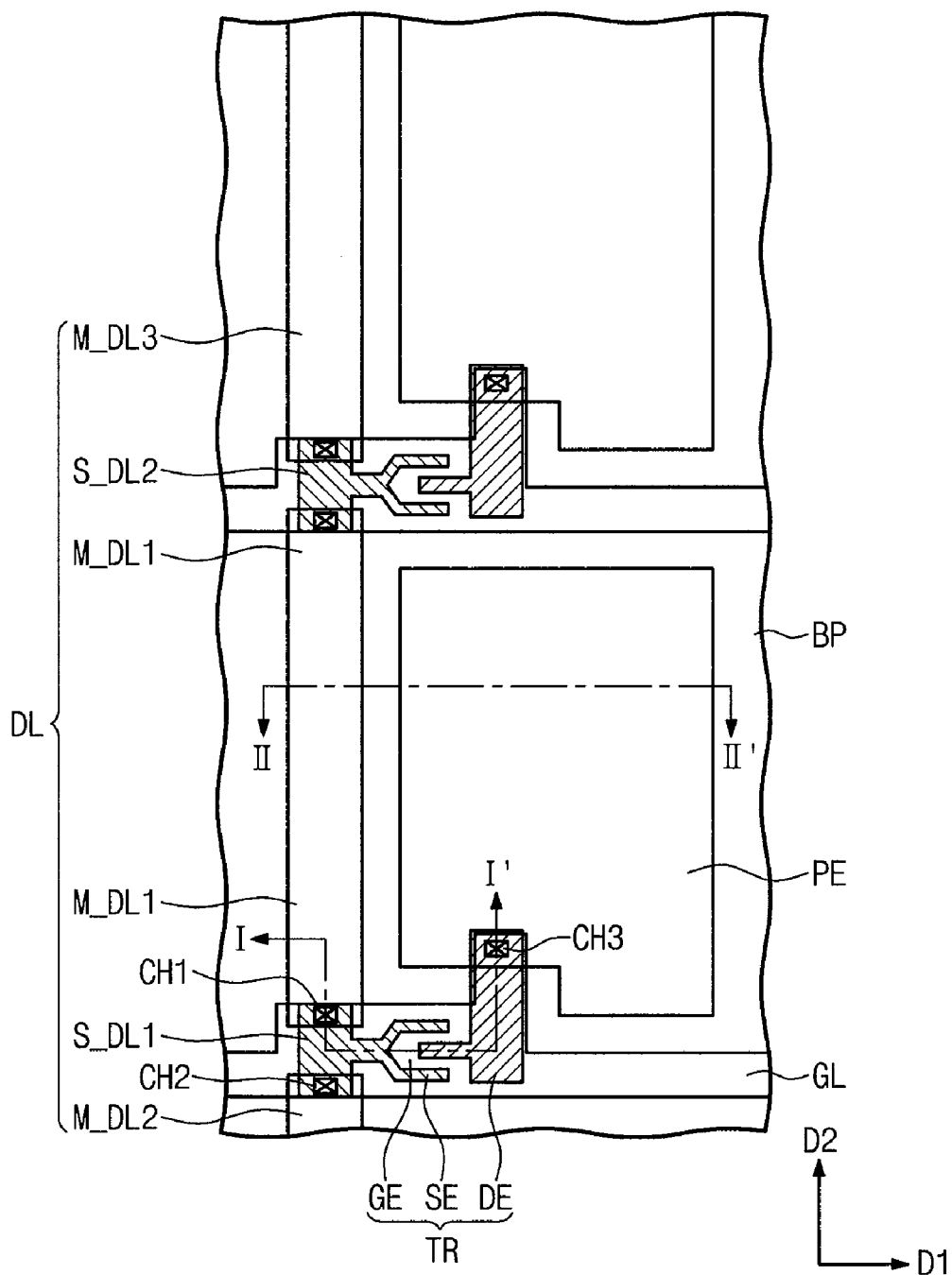
FIG. 1 is a plan view showing an exemplary embodiment of a display substrate according to the present invention.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Figure 2A:
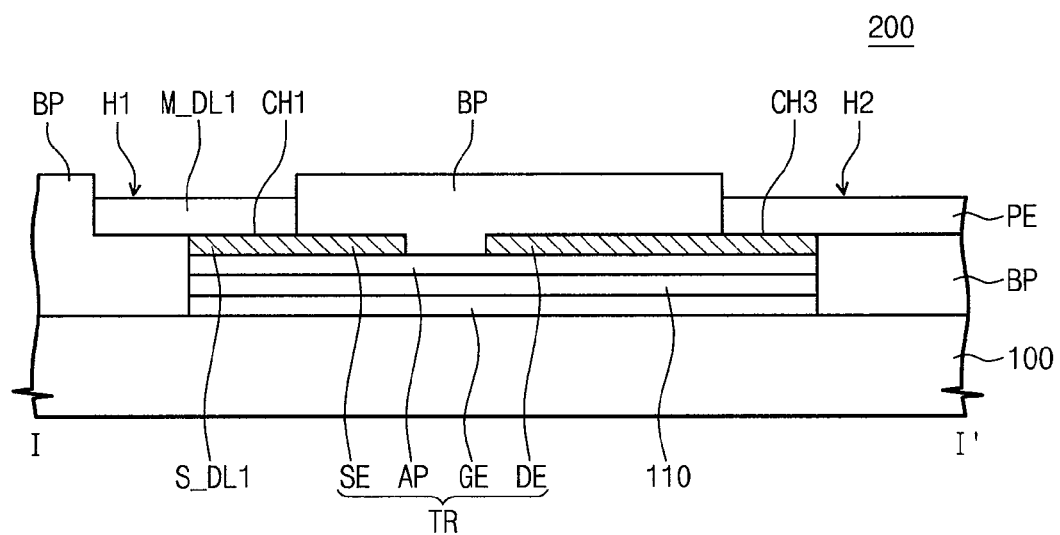
FIG. 2A is a cross-sectional view taken along a line I-I' of FIG. 1, in accordance with an embodiment.
Figure 2B:
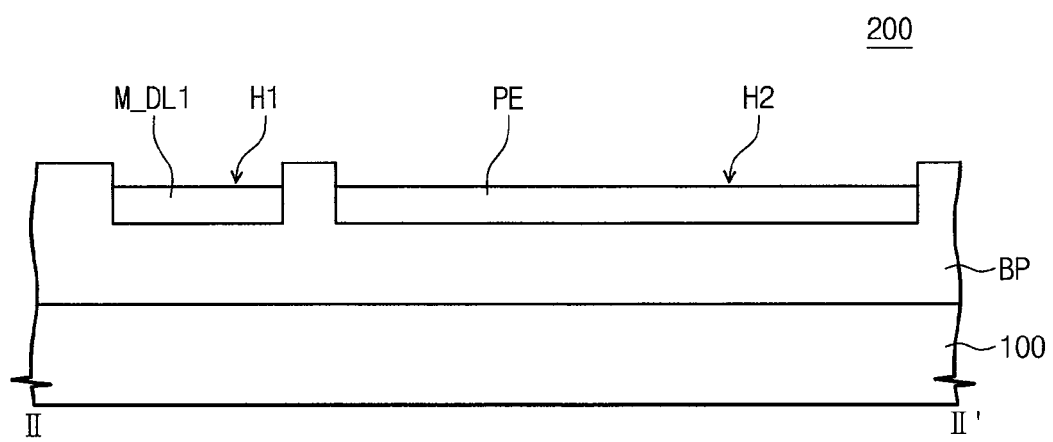
FIG. 2B is a cross-sectional view taken along a line II-II' of FIG. 1, in accordance with an embodiment.

FIG. 1 is a plan view showing an exemplary embodiment of a display substrate according to the present invention, FIG. 2A is a cross-sectional view taken along a line I-I' of FIG. 1, and FIG. 2B is a cross-sectional view taken along a line II-II' of FIG. 1, in accordance with one or more embodiments. In the present exemplary embodiment, the display substrate 200 includes a plurality of pixel areas and a plurality of pixels arranged in the pixel areas in one-to-one correspondence. Because the pixels have the same circuit configuration and function, only two pixels arranged adjacent to each other will be illustrated in FIG. 1, and others will be omitted. In one aspect, a pixel arranged in a lower portion of the two pixels will be described.

Referring to FIGS. 1, 2A, and 2B, a display substrate 200 includes a substrate 100, a gate line GL, a data line DL, a pixel electrode PE, a thin film transistor TR, and a bank pattern BP. In one embodiment, the substrate 100 comprises a plastic substrate and has flexibility. The substrate 100 may include a plastic material, such as polyethylene-terephthalate (PET), poly-carbonate (PC), polyethylene-naphthalate (PEN), poly-ether-sulfone (PES), fiber reinforced plastic (FRP), and the like.

The gate line GL extends in a first direction D1 and is arranged on the substrate 100, and the gate line GL transmits a gate signal to the thin film transistor TR to turn on the thin film transistor TR. The data line DL is insulated from the gate line GL by a gate insulating layer 110 and arranged on the substrate 100, and the data line DL extends in a second direction D2 that is substantially perpendicular to the first direction D1 in a plan view. When the thin film transistor TR is turned on, a data signal transmitted through the data line DL is transmitted to the pixel electrode PE.

The data line DL includes a plurality of main data lines and a plurality of sub-data lines. Each sub-data line is arranged between two main data lines arranged adjacent to each other in the second direction D2 to partially overlap the two main data lines in a plan view. For example, a first sub-data line S_DL1 is arranged between a first main data line M_DL1 and a second main data line M_DL2 in a plan view, and the first sub-data line S_DL1 partially overlaps each of the first and second main data lines M_DL1 and M_DL2.

Each sub-data line is electrically connected to the two main data lines. For example, the first sub-data line S_DL1 is electrically connected to the first main data line M_DL1 in a first contact part CH1, and the first sub-data line S_DL1 is electrically connected to the second main data line M_DL2 in a second contact part CH2. In the same way, a second sub-data line S_DL2 is electrically connected to the first main data line M_DL1 and a third main data line M_DL3. Thus, in the display substrate 200, the data line DL including the first to third main data lines M_DL1, M_DL2, and M_DL3 and the first to second sub-data lines S_DL1 and S_DL2 may serve as an electrical wire that transmits an electrical signal.

The gate line GL crosses the data line DL to define a pixel area in the substrate 100 in a plan view, and the pixel electrode PE is arranged in the pixel area. Although the pixel area is not separately illustrated in FIG. 1, the pixel area may be defined as an area where the pixel electrode PE is formed in a plan view.

The thin film transistor TR includes a gate electrode GE, an active pattern AP, a source electrode SE, and a drain electrode DE. The gate electrode GE branches from the gate line GL. The active pattern AP is arranged on the gate electrode GE while interposing the gate insulating layer 110 therebetween to form a channel area of the thin film transistor TR. In one aspect, the drain electrode DE branches from the first sub-data line S_DL1, and the source electrode SE and the drain electrode DE are spaced from each other and arranged on the active pattern AP.

In the present exemplary embodiment, since the active pattern AP is patterned together with the gate electrode GE and the gate line GL, the active pattern AP has a shape approximately the same as a shape defined by a shape of the gate electrode GE and a shape of the gate line GL in a plan view. However, the active pattern AP may be patterned with a different process from that of the gate electrode GE and the gate line GL, and the shape of the active pattern AP may be different from the shape defined by the shape of the gate electrode GE and the shape of the gate line GL in a plan view.

In one aspect, although not shown in FIG. 1, the display substrate 200 may include an ohmic contact pattern (not shown) that is arranged under the source electrode SE and the drain electrode DE to make contact with the active pattern AP.

The bank pattern BP is arranged on the substrate 100 to partially overlap the thin film transistor TR in a plan view. The bank pattern BP is provided with openings formed therethrough to define positions of the main data lines and the pixel electrodes. For instance, a first opening H1 is formed through the bank pattern BP, and the first main data line M_DL1 is contained in the first opening H1. In one aspect, a second opening H2 is formed through the bank pattern BP, and the pixel electrode PE is contained in the second opening H2.

In one implementation, the first opening H1 partially overlaps the first sub-data line S_DL1 in a plan view. Thus, the first main data line M_DL1 contained in the first opening H1 is electrically connected to the first sub-data line S_DL1 in the first contact part CH1. In another implementation, the second opening H2 partially overlaps the pixel electrode PE in a plan view. Thus, the pixel electrode PE contained in the second opening H2 is electrically connected to the drain electrode DE in a third contact part CH3.

In the present exemplary embodiment, since the first to third main data lines M_DL1 to M_DL3 and the pixel electrode PE are formed through the same manufacturing process, the first to third main data lines M_DL1 to M_DL3 and the pixel electrode PE may include the same conductive material. The conductive material may include indium-tin-oxide, or conductive powder particles, such as, Ag-nanocomposite, Cu-nanocomposite, and Carbon-nanocomposite. Additional disclosure of the above is provided herein, for example, with reference to FIG. 8.

Figure 3:
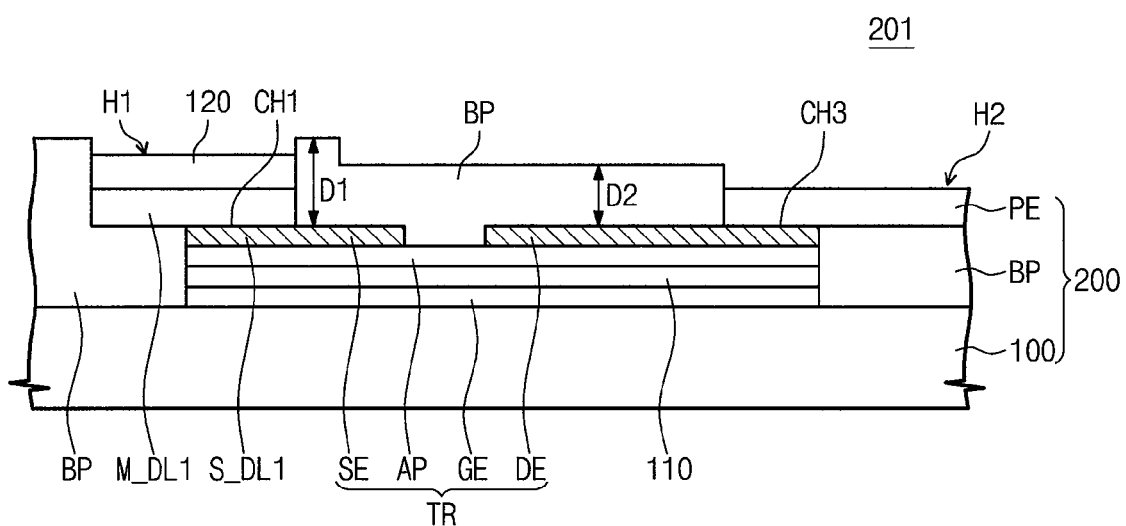
FIG. 3 is a cross-sectional view showing another exemplary embodiment of a display substrate according to the present invention.

FIG. 3 is a cross-sectional view showing another exemplary embodiment of a display substrate according to the present invention. When comparing a display substrate 201 shown in FIG. 3 with the display substrate 200 shown in FIG. 1, the display substrate 201 may include an insulating layer pattern 120, and a bank pattern BP having a step-height difference. That is, in one example, except for the insulating layer pattern 120 and the bank pattern BP, the display substrate 201 has the same elements as those of the display substrate 200. Therefore, only the insulating layer pattern 120 and the bank pattern will be described in detail in the present exemplary embodiment, and thus descriptions of the same elements will be omitted.

Referring to FIG. 3, the display substrate 201 includes the bank pattern BP that is provided with a first opening H1 and a second opening H2. The bank pattern BP has a different thickness in different parts thereof to have a step-height difference. More particularly, the bank pattern BP is partially removed by a first depth D1 to form the first opening H1, and the bank pattern BP is partially removed by a second depth D2 to form the second opening H2.

A first main data line M_DL1 is contained in the first opening H1, and the first main data line M_DL1 is electrically connected to a first sub-data line S_DL1 in a first contact part CH1. In one aspect, the insulating layer pattern 120 is arranged on the first main data line M_DL1 to cover the first main data line M_DL1.

As described above, when the bank pattern BP is formed to have the step-height difference, the insulating layer pattern 120 may be formed on the first main data line M_DL1. For example, in case that the insulating layer pattern 120 is formed by an inkjet method, the first opening H1 is formed with the first depth D1 that is deeper than the second depth D2 such that an insulating material is easily dripped onto the first main data line M_DL1 to form the insulating layer pattern 120.

Figure 4:
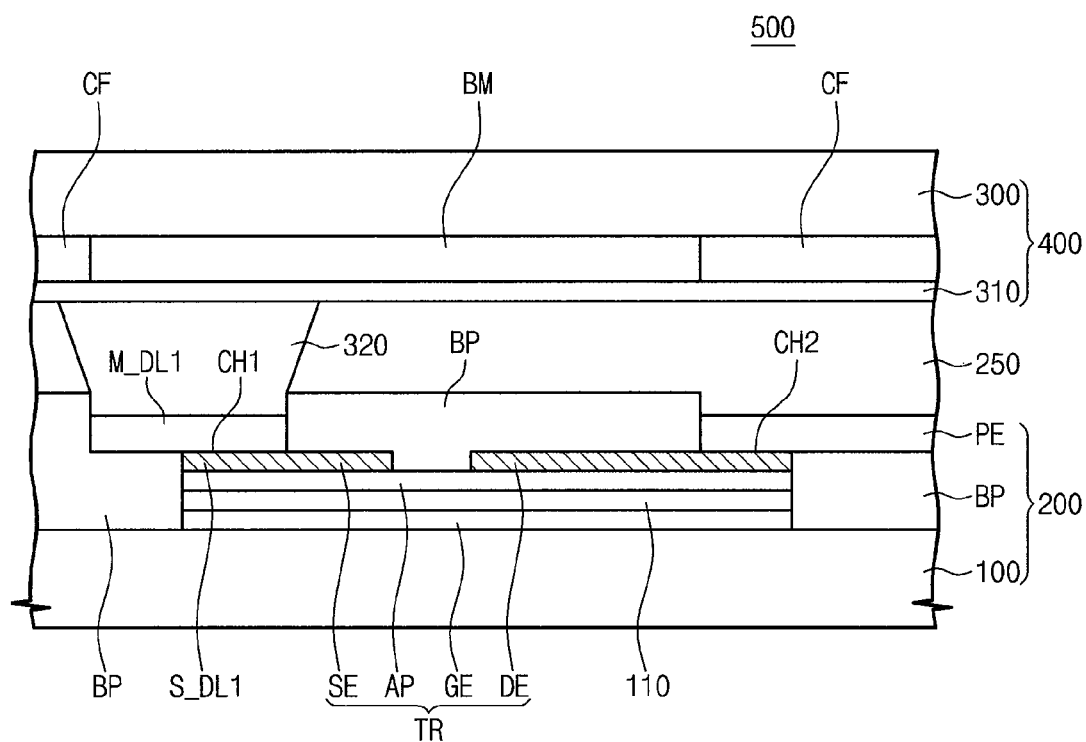
FIG. 4 is a cross-sectional view showing another exemplary embodiment of a display apparatus according to the present invention.

FIG. 4 is a cross-sectional view showing another exemplary embodiment of a display apparatus according to the present invention. In FIG. 4, a display apparatus 500 includes a display substrate 200 and a color filter substrate 400 that is coupled with the display substrate 200, and the display substrate 200 has the same structure and function as those of the display substrate 200 shown in FIG. 2A. Thus, detailed descriptions of the display substrate 200 will be omitted in FIG. 4.

Referring to FIG. 4, the display apparatus 500 includes the display substrate 200, the color filter substrate 400 facing the display substrate 200, and a liquid crystal 250 interposed between the display substrate 200 and the color filter substrate 400. The color filter substrate 400 includes an opposite substrate 300, a black matrix BM, a color filter CF, a common electrode 310, and a spacer 320. The black matrix BM is arranged on the opposite substrate 300 to block light passing through the opposite substrate 300, and the color filter CF filters a white light passing through the color filter CF to display a certain color. The common electrode 310 is arranged on the black matrix BM and the color filter CF and forms an electric field together with a pixel electrode PE to control an alignment direction of the liquid crystal 250.

The spacer 320 includes an insulating material, such as an organic material having photosensitivity, and the spacer 320 is arranged on the common electrode 310 to make contact with a first main data line M_DL1. Thus, in one aspect, the spacer 320 maintains a distance between the color filter substrate 400 and the display substrate 200.

The spacer 320 includes the insulating material and makes contact with the first main data line M_DL1 to cover the first main data line M_DL1. Therefore, in one aspect, even though no additional insulating layer is formed on the first main data line M_DL1, the spacer 320 may serve as an insulating layer that covers the first main data line M_DL1.

Figure 5A:
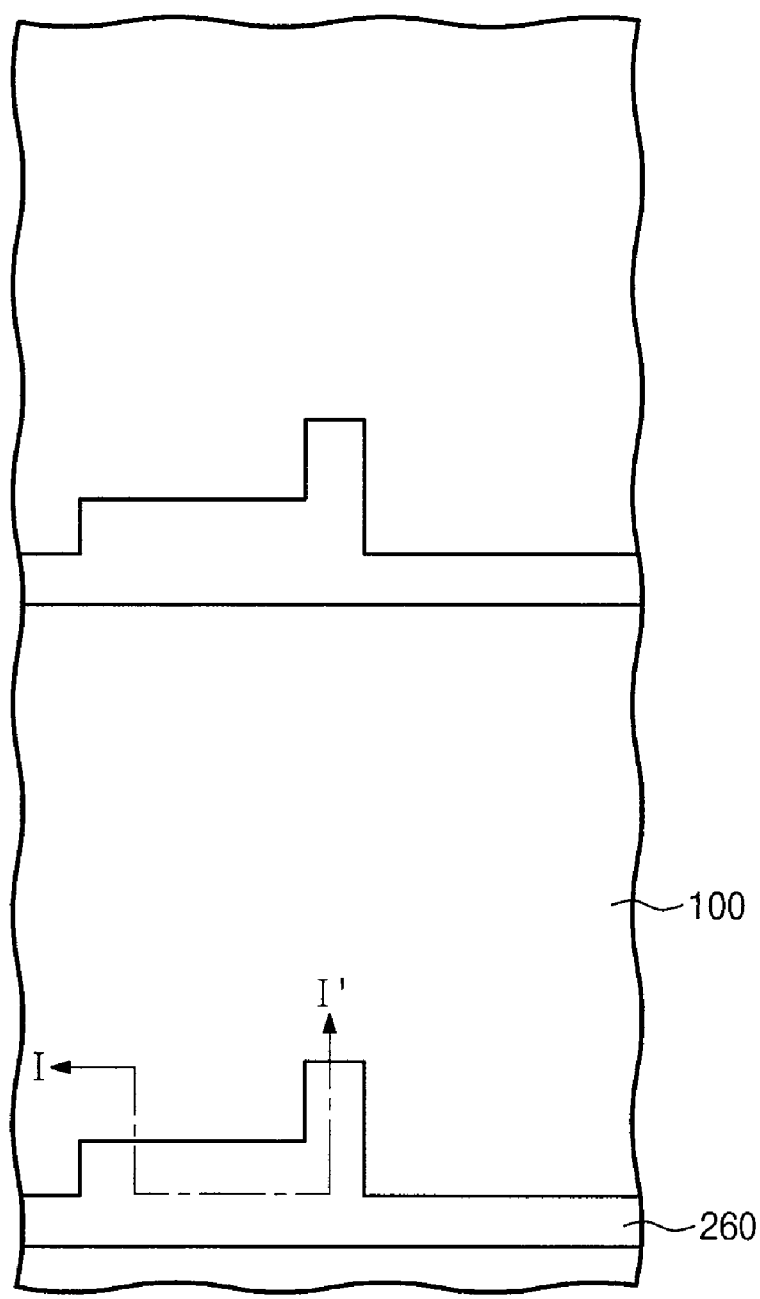
FIGS. 5A, 6A, and 7A are plan views showing a manufacturing process of the display substrate of FIG. 1, in accordance with an embodiment.
Figure 5B:
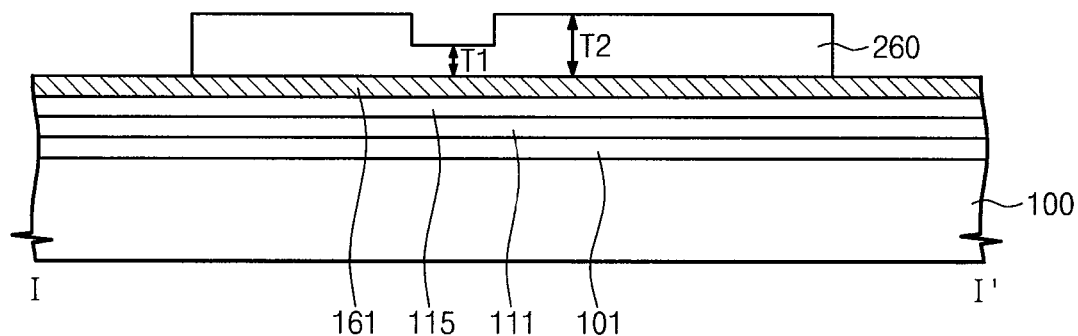
FIGS. 5B and 5C are cross-sectional views showing the manufacturing process of the display substrate of FIG. 1, in accordance with an embodiment.
Figure 5C:
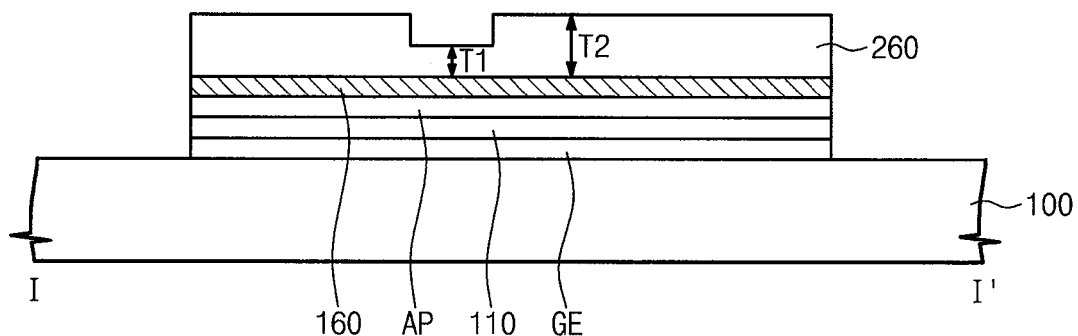
Figure 6A:
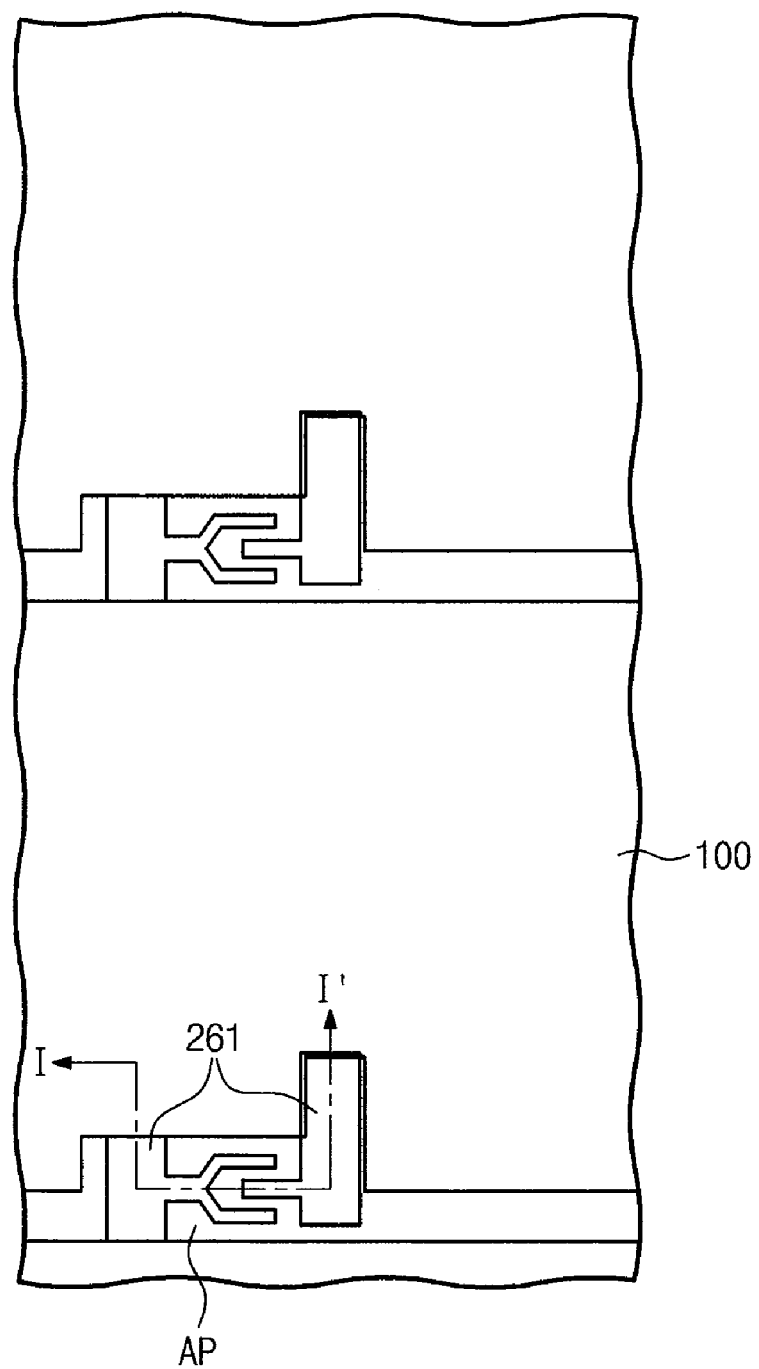
Figure 6B:
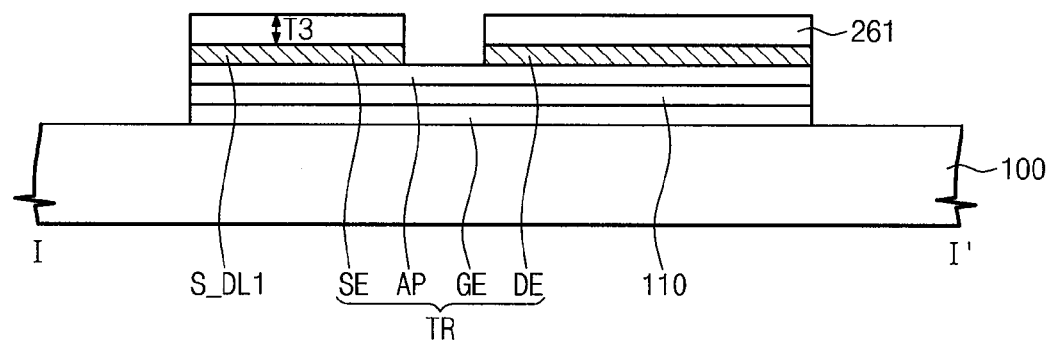
FIG. 6B is a cross-sectional view taken along a line I-I' of FIG. 6A, in accordance with an embodiment.
Figure 7A:
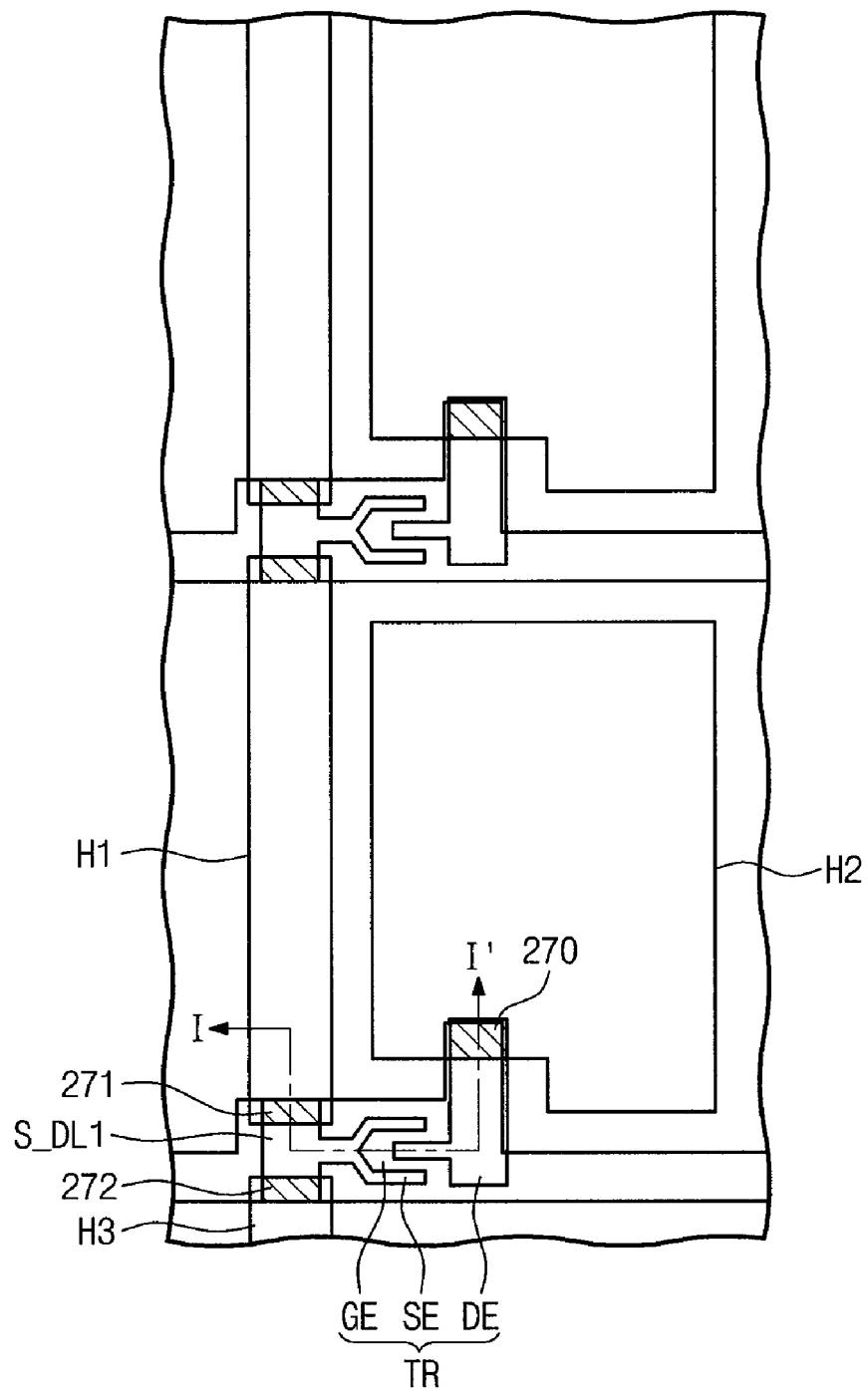
Figure 7B:
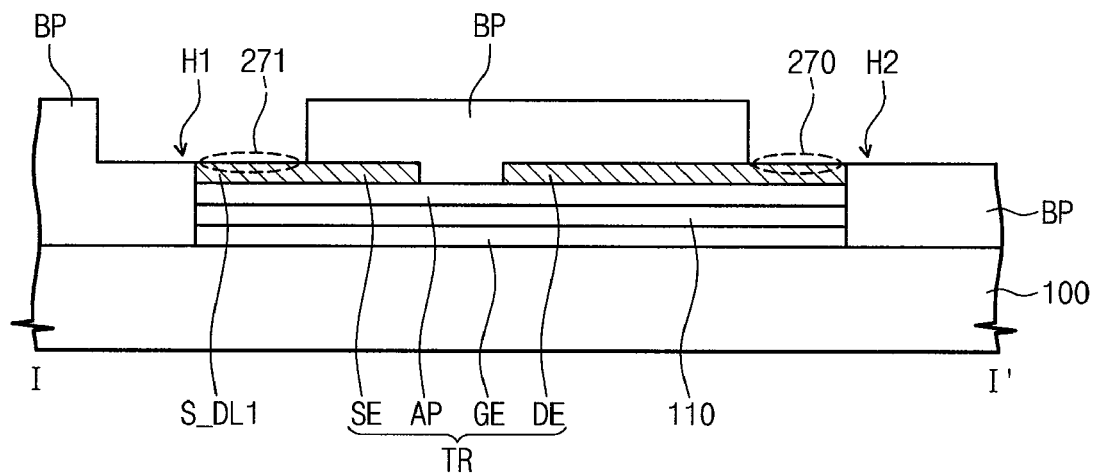
FIG. 7B is a cross-sectional view taken along a line I-I' of FIG. 7A, in accordance with an embodiment.

FIGS. 5A to 7A are plan views showing a manufacturing process of the display substrate of FIG. 1, FIG. 5C is a cross-sectional view taken along a line I-I' of FIG. 5A, FIG. 5B is a cross-sectional view showing a manufacturing process of a display substrate prior to a manufacturing process of the display substrate shown in FIG. 5C, FIG. 6B is a cross-sectional view taken along a line I-I' of FIG. 6A, and FIG. 7B is a cross-sectional view taken along a line I-I' of FIG. 7A, in accordance with one or more embodiments.

Referring to FIGS. 5A, 5B, and 5C, a first conductive layer 101, a preliminary gate insulating layer 111, an active layer 115, a second conductive layer 161, and a first mask pattern 260 are sequentially formed on a substrate 100. The first conductive layer 101, the preliminary gate insulating layer 111, the active layer 115, and the second conductive layer 161 are patterned using the first mask pattern 260 as a mask. As a result, a gate electrode GE, a gate insulating layer 110, an active pattern AP, and a preliminary source-drain pattern 160 are formed on the substrate 100.

The first mask pattern 260 has a different thickness in each portion thereof. More particularly, a portion of the first mask pattern 260 corresponding to a source electrode SE (shown in FIG. 1), a drain electrode DE (shown in FIG. 1), and a first sub-data line S_DL1 (shown in FIG. 1) has a second thickness T2, and a remaining portion of the first mask pattern 260 except the portion has a first thickness T1 that is thinner than the second thickness T2.

In one embodiment, the first mask pattern 260 may be formed by an imprint method. In case that the first mask pattern 260 is formed by the imprint method, an insulating layer (not shown) that is cured by heat or light is formed on the substrate 100. Then, the insulating layer is pressed by a pressing mold, and the insulating layer is cured to form the first mask pattern 260. In another embodiment, besides the imprint method, the first mask pattern 260 may be formed by a slit exposing method using a slit mask to have a different thickness in each portion thereof.

Referring to FIGS. 6A and 6B, the first mask pattern 260 (shown in FIG. 5C) is etched to form a second mask pattern 261 having a third thickness T3. More particularly, when an entire surface of the first mask pattern is etched by the first thickness T1 (shown in FIG. 5C), the portion of the first mask pattern having the first thickness T1 is removed, and the portion of the first mask pattern having the second thickness T2 (shown in FIG. 5B) has a third thickness T3 that is equal to a difference between the first thickness T1 and the second thickness T2.

After forming the second mask pattern 261, the preliminary source-drain pattern 160 (as shown in FIG. 5B) is patterned using the second mask pattern 261 as a mask. Thus, in one aspect, a thin film transistor TR having the first sub-data line S_DL1, the source electrode SE, and the drain electrode DE is completed.

In one embodiment, during the manufacturing process of the display substrate 200 (in reference to FIG. 2A) illustrated in FIGS. 5A to 6B, the gate electrode GE, the active pattern AP, the source electrode SE, and the drain electrode DE are patterned using the first and second mask patterns 260 and 261. The first mask pattern 260 may be formed by the imprint method, and the second mask pattern 261 is formed by etching the first mask pattern 260. When the first mask pattern 260 is formed by the imprint method instead of a photolithography method, the substrate 100 including the plastic material may be prevented from being deformed due to a process condition, such as temperature, humidity, and/or the like.

After sequentially forming layers for the gate electrode GE, the active pattern AP, the source electrode SE, and the drain electrode DE on the substrate 100, the layers are sequentially patterned using the first and second mask patterns 260 and 261. Thus, in one aspect, the substrate 100 may be prevented from being deformed during the manufacturing processes applied to form the gate electrode GE, the active pattern AP, the source electrode SE, and the drain electrode DE, thereby preventing distortion of alignment among the gate electrode GE, the active pattern AP, the source electrode SE, and the drain electrode DE.

In one embodiment, although not shown in the figures, after the first sub-data line S_DL1, the source electrode SE, and the drain electrode DE are formed, the second mask pattern 261 is removed. In another embodiment, in a case that an ohmic contact pattern is formed under the source electrode SE and the drain electrode DE, the ohmic contact pattern is patterned together with the source electrode SE and the drain electrode DE using the second mask pattern 261, and the ohmic contact pattern may have the same shape as that of the source electrode SE and the drain electrode DE in a plan view.

Referring to FIGS. 7A and 7B, a bank pattern BP is formed on the substrate 100. The bank pattern BP is provided with a first opening H1, a second opening H2, and a third opening H3, which are formed through the bank pattern BP. Thus, in one aspect, a first end portion 271 of the first sub-data line S_DL1 is exposed to an exterior through the first opening H1, an end portion 270 of the drain electrode DE is exposed to the exterior through the second opening H2, and a second end portion 272 of the first sub-data line S_DL1 is exposed to the exterior through the third opening H3. The bank pattern BP may be formed by the imprint method. The manufacturing method of the bank pattern BP is described in greater detail herein with reference to FIGS. 9A and 9B, in accordance with one or more embodiments.

Figure 8:
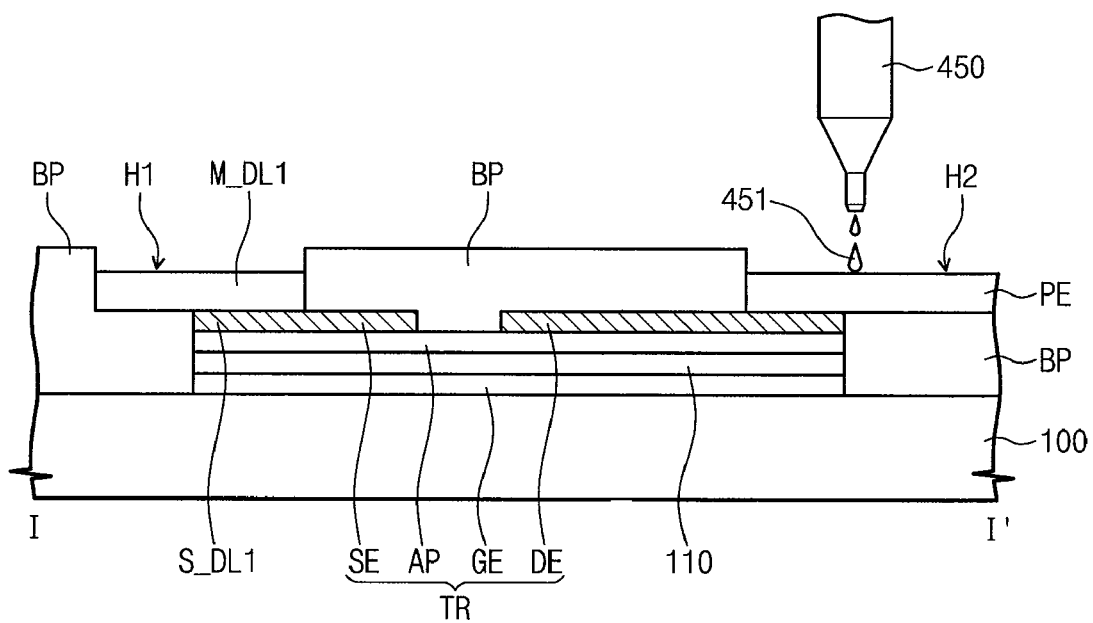
FIG. 8 is a cross-sectional view showing a manufacturing process of a display substrate after a manufacturing process of a display substrate shown in FIG. 7B, in accordance with an embodiment.

FIG. 8 is a cross-sectional view showing a manufacturing process of a display substrate after the manufacturing process of the display substrate shown in FIG. 7B, in accordance with an embodiments.

Referring to FIG. 8, after the bank pattern BP is formed, the first opening H1 and the second opening H2 are filled with an insulating material 451 using a dispenser 450. Thus, in one aspect, the first main data line M_DL1 electrically connected to the first sub-data line S_DL1 is formed, and the pixel electrode PE electrically connected to the drain electrode DE is formed.

The conductive material 451 may include conductive powder particles, such as Ag-nanocomposite, Cu-nanocomposite, and Carbon-nanocomposite, the conductive material 451 may include conductive particles, such as silver and solvent, that dissolves the conductive particles, or the conductive material 451 may include indium-tin-oxide in liquid phase, which is dissolved by the solvent.

As described above, in case that the conductive material 451 is dripped into the first opening H1 and the second opening H2 to form the first sub-data line S_DL1 and the first main data line M_DL1, respectively, the deformation of the substrate 100 including the plastic material, which is caused by the process condition, such as temperature and/or humidity, may be minimized. However, in case that the layers are deposited and patterned by the photolithography method to form the first sub-data line S_DL1 and the first main data line M_DL1, the substrate 100 including the plastic material may be deformed due to temperature and/or humidity during the deposition and patterning process of the layers.

Figure 9A:
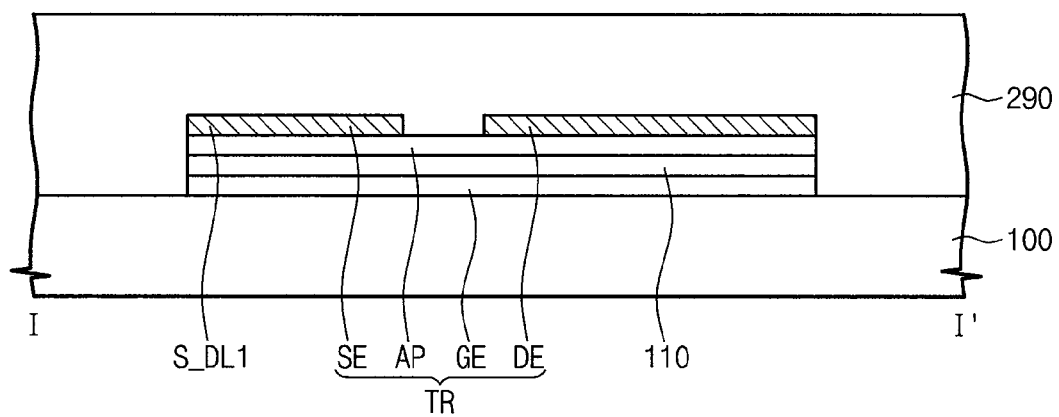
FIGS. 9A and 9B are cross-sectional views showing a manufacturing process of a bank pattern of FIG. 7B, in accordance with an embodiment.
Figure 9B:
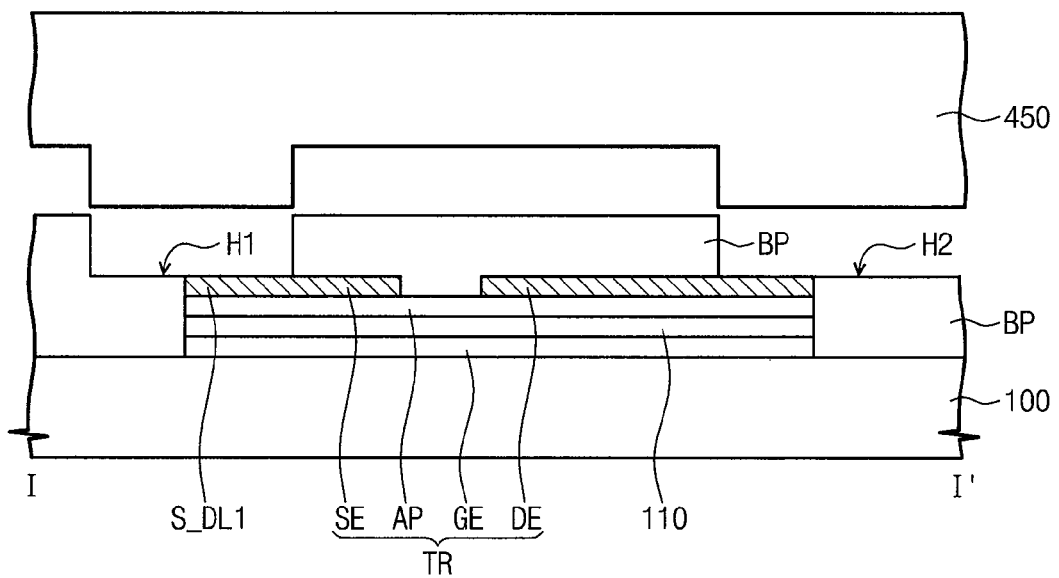

FIGS. 9A and 9B are cross-sectional view showing a manufacturing process of the bank pattern of FIG. 7B, in accordance with one or more embodiments. Referring to FIGS. 9A and 9B, a bank layer 290 is formed on the substrate 100 on which a thin film transistor TR is formed. The bank layer 290 is desirable to have an insulating property and a heat curing property as an organic photoresist layer.

After forming the bank layer 290, the bank layer 290 is pressed by a pressing mold 450, and the bank layer 290 is cured to form a bank pattern BP. The pressing mold 450 has a concavo-convex shape opposite to that of the bank pattern BP. For example, the pressing mold 450 has a convex shape protruded from its surface corresponding to the first and second openings H1 and H2 formed on the bank pattern BP.

According to the above, the patterning process using the photolithography method may be replaced with the patterning process using the imprint method or the inkjet method, and thus the manufacturing method of the display substrate may be simplified. In case the display substrate includes the plastic substrate, the plastic substrate may be prevented from being deformed due to the photolithography method, thereby accurately arranging elements of the display substrate on the plastic substrate.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display substrate comprising:
a substrate having pixel areas;
a gate line arranged on the substrate;

a data line insulated from the gate line and arranged on the substrate;

a bank pattern arranged on the substrate to cover the gate line and the data line, wherein the bank pattern is provided with a first opening formed therethrough; and a pixel electrode arranged in each pixel area to receive a data signal from the data line, wherein the data line comprises a sub-data line and a main data line contained in the first opening to be electrically connected to the sub-data line and wherein the first opening is disposed between two pixel areas adjacent to each other.

2. The display substrate of claim 1, further comprising:

a thin film transistor electrically connected to the pixel electrode and arranged on the substrate, the thin film transistor being turned on by a gate signal applied from the gate line to switch the data signal applied to the pixel electrode, wherein the thin film transistor comprises:

a gate electrode branched from the gate line;

a semiconductor pattern arranged on the gate electrode;

a source electrode branched from the sub-data line and arranged on the semiconductor pattern; and a drain electrode spaced apart from the source electrode and arranged on the semiconductor pattern.

3. The display substrate of claim 2, wherein the bank pattern further comprises a second opening formed therethrough to cover the thin film transistor, and the pixel electrode is contained in the second opening to be electrically connected to the drain electrode.

4. The display substrate of claim 3, wherein the pixel electrode and the main data line comprise a same material.

5. The display substrate of claim 3, further comprising an insulating layer pattern contained in the first opening to cover the main data line.

6. The display substrate of claim 5, wherein the bank pattern is removed by a first depth to form the first opening, and the bank pattern is removed by a second depth that is smaller than the first depth to form the second opening.

7. The display substrate of claim 1, wherein the substrate comprises a plastic material.

8. The display substrate of claim 1, wherein the gate line extends in a first direction, the data line extends in a second direction that is substantially perpendicular to the first direction, and the sub-data line overlaps two main data lines arranged adjacent to each other in the second direction in a plan view and is electrically connected to the two main data lines.

9. The display substrate of claim 8, wherein the main data line and the sub-data line are alternately arranged in a plan view.

10. A display apparatus comprising:

a first substrate having pixel areas;

a second substrate facing the first substrate;

a gate line arranged on the first substrate;

a data line insulated from the gate line and arranged on the first substrate;

a bank pattern arranged on the first substrate to cover the gate line and the data line, wherein the bank pattern is provided with a first opening formed therethrough; and a pixel electrode arranged in each pixel area to receive a data signal from the data line, wherein the data line comprises at least one sub-data line and at least one main data line contained in the first opening to be electrically connected to the sub-data line and wherein the first opening is disposed between two pixel areas adjacent to each other.

11. The display apparatus claim 10, further comprising:

a thin film transistor electrically connected to the pixel electrode and arranged on the substrate, the thin film transistor being turned on by a gate signal applied from the gate line to switch the data signal applied to the pixel electrode, wherein the bank pattern further comprises a second opening formed therethrough to cover the thin film transistor, and the pixel electrode is contained in the second opening to be electrically connected to the thin film transistor.

12. The display apparatus of claim 11, wherein the pixel electrode and the main data line comprise a same material.

13. The display apparatus of claim 10, further comprising a spacer that is interposed between the first substrate and the second substrate to maintain a distance between the first and second substrates and covers the main data line.

* * * * *